US011756837B2

(12) United States Patent
Zota et al.

(10) Patent No.: US 11,756,837 B2
(45) Date of Patent: Sep. 12, 2023

(54) HYBRID NANOSHEET TUNNEL-FET/CMOS TECHNOLOGY

(71) Applicant: International Business Machines Corporation, Armonk, NY (US)

(72) Inventors: Cezar Bogdan Zota, Ruschlikon (CH); Clarissa Convertino, Rueschlikon (CH); Kirsten Emilie Moselund, Rüschlikon (CH)

(73) Assignee: International Business Machines Corporation, Armonk, NY (US)

( * ) Notice: Subject to any disclaimer, the term of this patent is extended or adjusted under 35 U.S.C. 154(b) by 307 days.

(21) Appl. No.: 17/204,016

(22) Filed: Mar. 17, 2021

(65) Prior Publication Data
US 2022/0301942 A1    Sep. 22, 2022

(51) Int. Cl.
| | | |
|---|---|---|
| *H01L 21/8238* | (2006.01) | |
| *H01L 27/092* | (2006.01) | |
| *H01L 29/786* | (2006.01) | |
| *H01L 29/06* | (2006.01) | |

(Continued)

(52) U.S. Cl.
CPC ............ *H01L 21/823807* (2013.01); *H01L 21/823814* (2013.01); *H01L 27/092* (2013.01); *H01L 29/0665* (2013.01); *H01L 29/42392* (2013.01); *H01L 29/66742* (2013.01); *H01L 29/78618* (2013.01); *H01L 29/78681* (2013.01); *H01L 29/78696* (2013.01)

(58) Field of Classification Search
CPC ..... H01L 21/823807; H01L 21/823814; H01L 27/092; H01L 29/0665; H01L 29/42392; H01L 29/66742; H01L 29/78618; H01L 29/78681; H01L 29/78696
USPC ....................................................... 257/369
See application file for complete search history.

(56) References Cited

U.S. PATENT DOCUMENTS

| | | |
|---|---|---|
| 9,508,829 B1 | 11/2016 | Cheng et al. |
| 9,570,609 B2 | 2/2017 | Obradovic et al. |
| 9,647,098 B2 | 5/2017 | Obradovic et al. |

(Continued)

OTHER PUBLICATIONS

C. Convertino et al., "Sub-Thermionic Scalable III-V Tunnel Field-Effect Transistors Integrated on Si (100)," 2019 IEEE International Electron Devices Meeting (IEDM), San Francisco, CA, USA, 2019, pp. 37.1.1-37.1.4, doi: 10.1109/IEDM19573.2019.8993610.

(Continued)

*Primary Examiner* — Tong-Ho Kim
(74) *Attorney, Agent, or Firm* — Mark Bergner

(57) ABSTRACT

A method forms heterogeneous complementary FETs and a related semiconductor structure. The method comprises forming a layered nanosheet stack comprising two layers of a first channel material alternating with two layers of a second channel material, depositing a dielectric layer on a top layer of the nanosheet stack, and forming a checkered mask material with at least a first and a second row above the dielectric material. The first and the second row are distanced from each other. The method removes the first channel material and the second channel material outside an area of the checkered mask material, resulting in the at least a first row of pillars and a second row of pillars of layered nanosheet stacks. The method selectively removes in each of the pillars of the first stripe the second channel material.

20 Claims, 11 Drawing Sheets

(51) Int. Cl.
  *H01L 29/423* (2006.01)
  *H01L 29/66* (2006.01)

(56) References Cited

U.S. PATENT DOCUMENTS

| | | |
|---|---|---|
| 9,755,017 B1 | 9/2017 | Guillorn et al. |
| 9,960,232 B2 | 5/2018 | Obradovic et al. |
| 9,991,261 B2 | 6/2018 | Mitard |
| 10,090,193 B1 | 10/2018 | Chanemougame |
| 10,134,640 B1 | 11/2018 | Chiang |
| 10,256,158 B1 | 4/2019 | Frougier et al. |
| 10,263,075 B2 | 4/2019 | Bi et al. |
| 10,340,195 B2 | 7/2019 | Loubet et al. |
| 10,355,085 B1 | 7/2019 | Huang et al. |
| 10,388,569 B1 | 8/2019 | Cheng et al. |
| 10,510,622 B1 | 12/2019 | Frougier |
| 10,566,330 B2 | 2/2020 | Rodder et al. |
| 2008/0176366 A1 | 7/2008 | Mita et al. |
| 2012/0007052 A1* | 1/2012 | Hobbs ............... H01L 27/1211 977/762 |
| 2015/0295084 A1 | 10/2015 | Obradovic et al. |
| 2016/0020305 A1 | 1/2016 | Obradovic et al. |
| 2017/0040321 A1 | 2/2017 | Mitard |
| 2017/0323941 A1 | 11/2017 | Obradovic et al. |
| 2018/0277630 A1 | 9/2018 | Bi et al. |
| 2019/0097011 A1 | 3/2019 | Wu |
| 2019/0181140 A1 | 6/2019 | Rodder et al. |
| 2019/0198614 A1 | 6/2019 | Reboh et al. |
| 2019/0206994 A1 | 7/2019 | Huang et al. |
| 2020/0043926 A1 | 2/2020 | Ohtou et al. |
| 2020/0119015 A1 | 4/2020 | Bi et al. |
| 2020/0219970 A1 | 7/2020 | Mannebach |
| 2020/0365467 A1* | 11/2020 | Cheng ............... H01L 27/0924 |
| 2021/0184000 A1 | 6/2021 | Ramaswamy |
| 2022/0109046 A1 | 4/2022 | Hong |

OTHER PUBLICATIONS

Mookerjea, S. et al., "Experimental Demonstration of 100nm Channel Length In0.53Ga0.47As-based Vertical Inter-band Tunnel Field Effect Transistors (TFETs) for Ultra Low-Power Logic and SRAM Applications", Electrical Engineering, The Pennsylvania State University, 1 Materials Science and Engineering, Cornell University, 3 pages, 2009.

Sant, S. et al., "Impact of Non-idealities on the performance of InAs/(In) GaAsSb/GaSb tunnel FETs", 11 pages, Composants nanoélectroniques, 2018.

Elnaggar et al., "A comprehensive investigation of TFETs with semiconducting silicide source: impact of gate drain underlap and interface traps", Semicond. Sci. Technol. vol. 34, No. 4, 4 pages, 2019.

Krishnaraja, A. et al., "Reducing ambipolar off-state leakage currents in III-V vertical nonowire tunnel FETs using gate-drain underlap", App. Phys. Lett. 115, 143505 (2019).

Cutaia, D. et al., "Complementary III-V Heterojunction Lateral NW Tunnel FET Technology on Si", Symposium on VLSI Technology Digest of Technical Papers, 12 pages, Published Date: Jun. 2016.

Lin, J., Antoniadis, D.A., Alamo, J.A., "Sub-30 nm InAs Quantum-Well MOSFETs with Self-Aligned Metal Contacts and Sub-1 nm EOT HfO2 Insulator", Microsystems Technology Laboratories, MIT, 24 pages, Dec. 12, 2012.

Loubel, N. et al., "Stacked Nanosheet Gate-All-Around Transistor to Enable Scaling Beyond FinFET", Conference Paper Jun. 2017, ResearchGate, 3 pages.

V. Saripalli, A. Mishra, S. Datta and V. Narayanan, "An energy-efficient heterogeneous CMP based on hybrid TFET-CMOS cores," 2011 48th ACM/EDAC/IEEE Design Automation Conference (DAC), 7 pages, 2011.

Lind, E. et al., III-V Heteroslructure Nanowire Tunnel FETs, Journal of the Electron Devices Society, vol. 3, No. 3, May 2015.

Pandey R. et al., Demonstration of p-type In0.7Ga0.3As/GaAS0. 35Sb0.65 and n-type GaAs0.4Sb0.6/In0.65Ga0.35As Complimentary Heterojunction Vertical Tunnel FETs for Ultra-Low Power Logic, VLSI, 2 pages, 2015.

IBM, List of IBM Patents or Patent Applications Treated as Related, Mar. 17, 2021, 2 pages.

U.S. Appl. No. 17/203,971, Complementary 3D Nanosheet Matrix FETS, filed Mar. 17, 2121.

\* cited by examiner

US 11,756,837 B2

HYBRID NANOSHEET TUNNEL-FET/CMOS TECHNOLOGY

BACKGROUND

Disclosed herein is a method for forming heterogeneous complementary field effect transistors (FETs), and more specifically, a method for forming heterogeneous complementary FETs using a compact stacked nanosheet process. The disclosure further describes a stacked nanosheet semiconductor structure of FETs positioned in separate rows.

Technology development in silicon and other semiconductor technology is developing fast and continues to be in line with Moore's law. Known standard FinFET processes are currently in use for development of certain semiconductor technologies.

SUMMARY

According to one aspect of the present disclosure, a method for forming heterogeneous complementary FETs using a compact stacked nanosheet process may be provided. The method may comprise forming on a first sacrificial layer and over a substrate a layered nanosheet stack comprising at least two layers of a first channel material alternating with at least two layers of a second channel material, depositing a dielectric layer on a top layer of the nanosheet stack, and forming a checkered mask material with at least a first and a second row above the dielectric material. The first and the second row are distanced from each other.

The method may further comprise removing the first channel material and the second channel material outside an area of the checkered mask material resulting in at least a first row of pillars and a second row of pillars of layered nanosheet stacks, and depositing a covering material over each of the dielectric layer over each of the separate pillars of layered nanosheet stacks. The covering material also covers sidewalls of the rows of layered nanosheet stacks, the sidewalls being positioned in parallel to a long extension of the first row and the second row and orthogonal to the substrate. Finally the method may comprise selectively removing in each of the pillars of the first row the second channel material.

According to another aspect of the present disclosure, a stacked nanosheet semiconductor structure of FETs positioned in separate rows may be provided. The structure may comprise layered nanosheet pillars, over a substrate, positioned in a first row with a first predefined distance to each other comprising at least two layers of a first channel material embedded in a gate-all-around structure, and layered nanosheet pillars over the substrate positioned in a second row with a second predefined distance from one another comprising at least two layers of a second channel material embedded in a gate-all-around structure, wherein the second channel material is different from the first material.

The structure may also comprise a dielectric material on a top layer of the nanosheet pillars also covering sidewalls of the pillars parallel to longitudinal extension of the first row and the second row, and wherein sidewalls of the pillar positioned vertically to the extension of the first and the second row and vertical to the substrate are not covered by the covering material.

The structure may also comprise alternating source and drain areas between the pillars in a direction of the first and the second row, wherein the source and drain areas are in contact with the at least first and second channel material, respectively, thereby building a sequence of directly connected FETs in each row.

BRIEF DESCRIPTION OF THE DRAWINGS

Various embodiments are described herein with reference to different subject-matters. In particular, some embodiments are described with reference to method type claims, whereas other embodiments are described with reference to apparatus type claims. However, a person skilled in the art will gather from the above and the following description that, unless otherwise notified, in addition to any combination of features belonging to one type of subject-matter, also any combination between features relating to different subject-matter, in particular, between features of the method type claims, and features of the apparatus type claims, is considered as to be disclosed within this document.

The aspects defined above and further aspects are apparent from the examples of embodiments to be described hereinafter and are explained with reference to the examples of embodiments, to which the invention is not limited.

Various embodiments of the invention will be described, by way of example only, and with reference to the following drawings.

Figure 1:
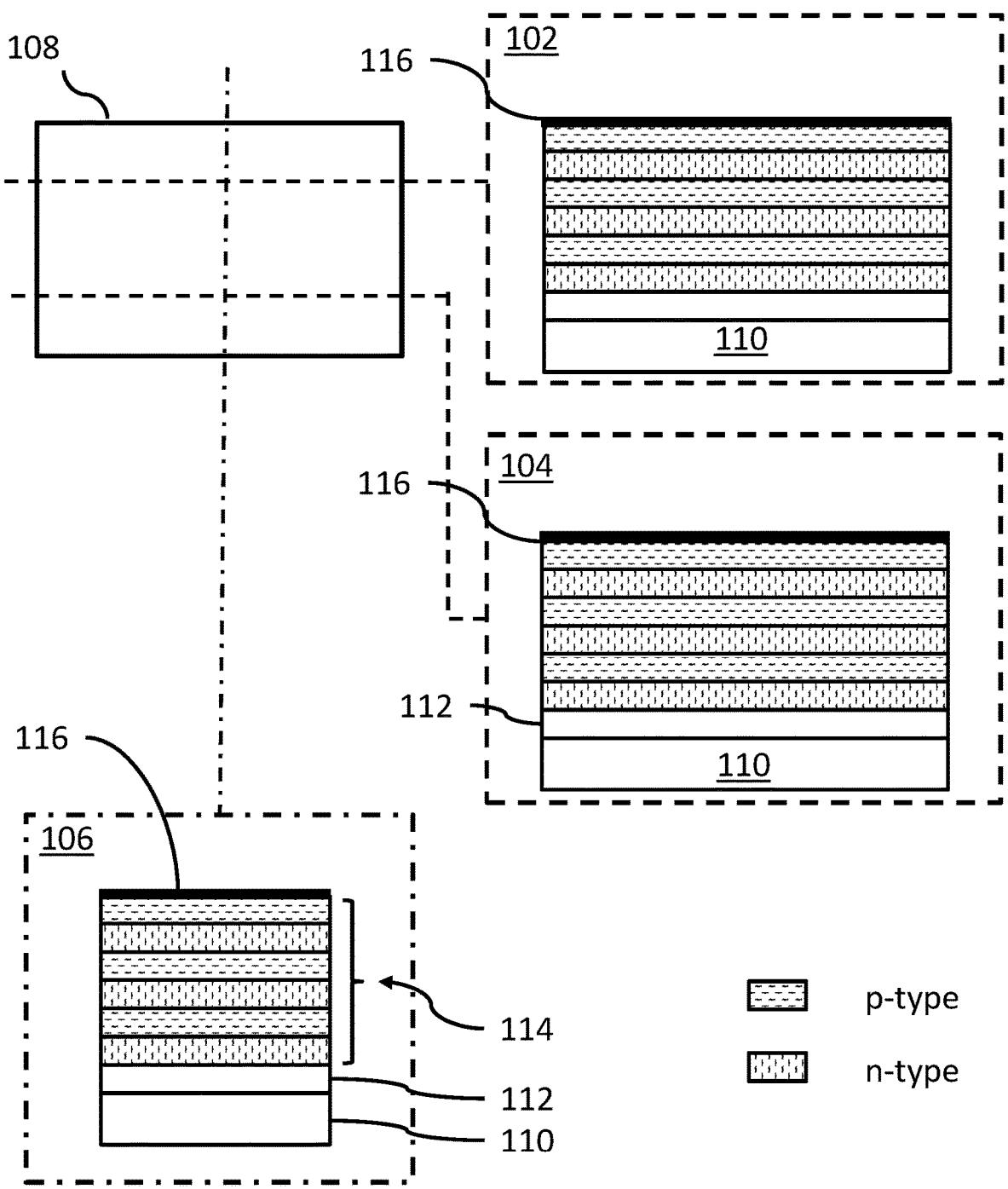

FIG. 1 shows a stack of nanosheet layers on a substrate, according to some embodiments.

Figure 2:
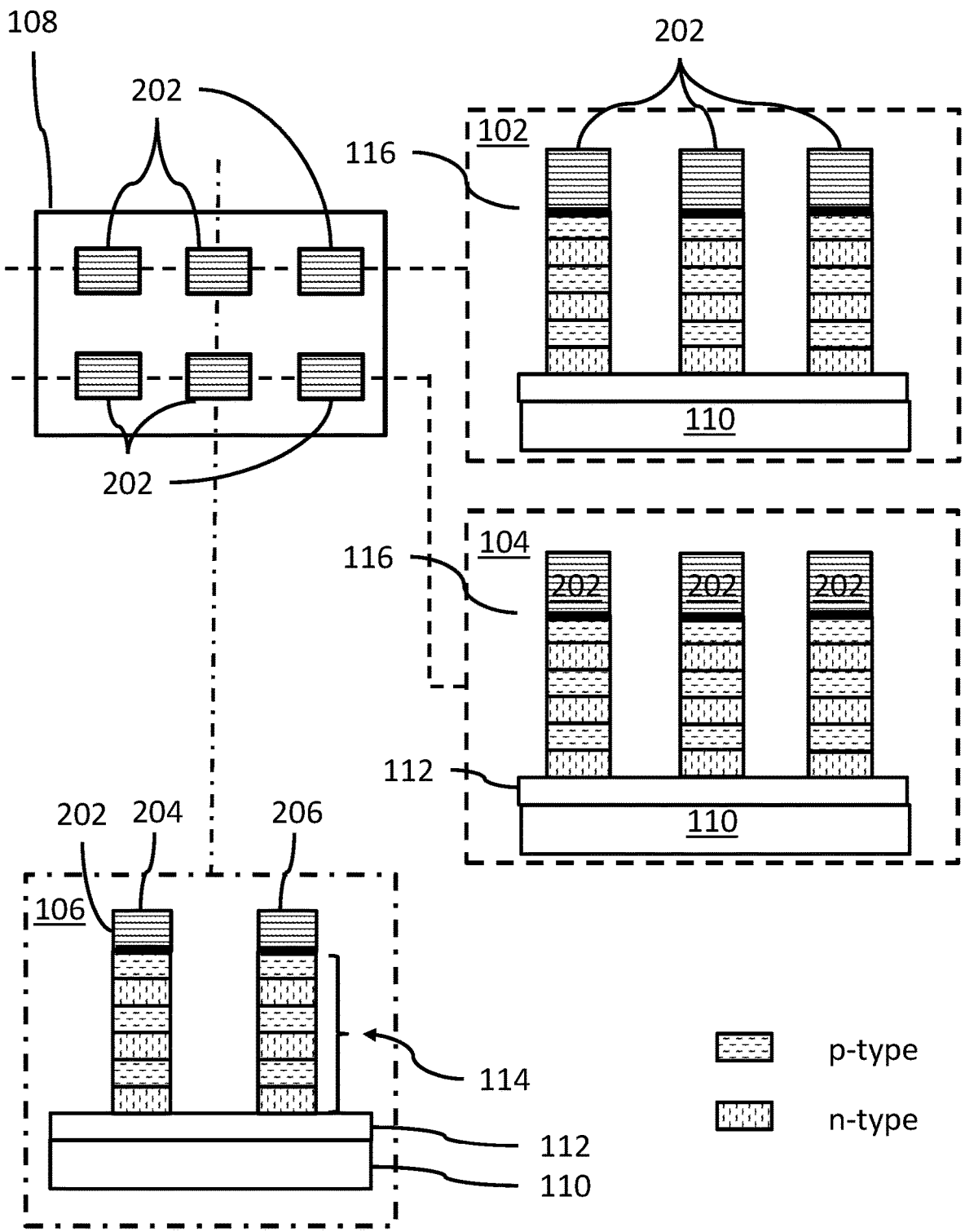

FIG. 2 shows a result of some embodiments of a deposition of a checkered-like mask and building rows of nanosheet pillars.

Figure 3:
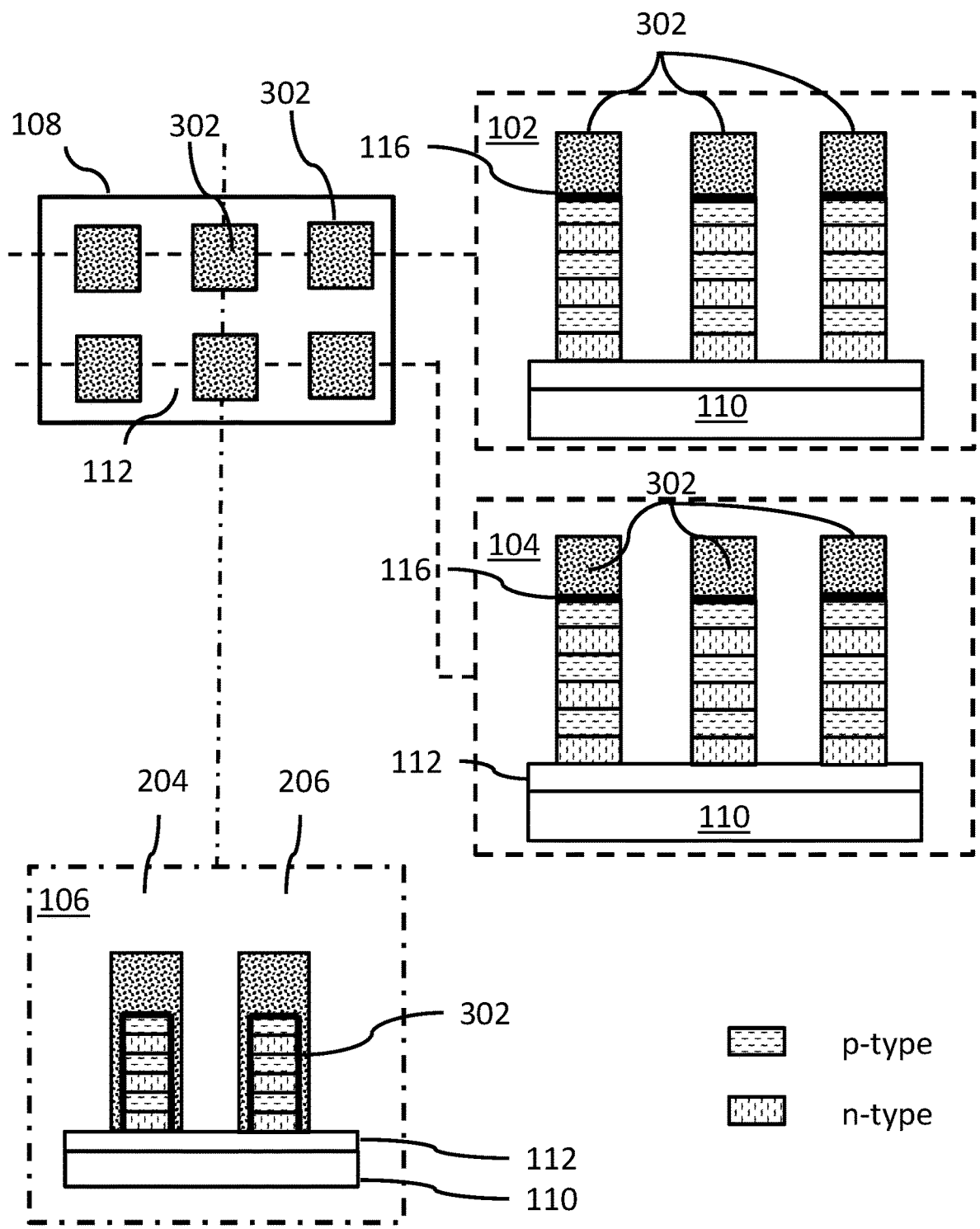

FIG. 3 shows deposited covering material over the individual nanosheet pillars, according to some embodiments.

Figure 4:
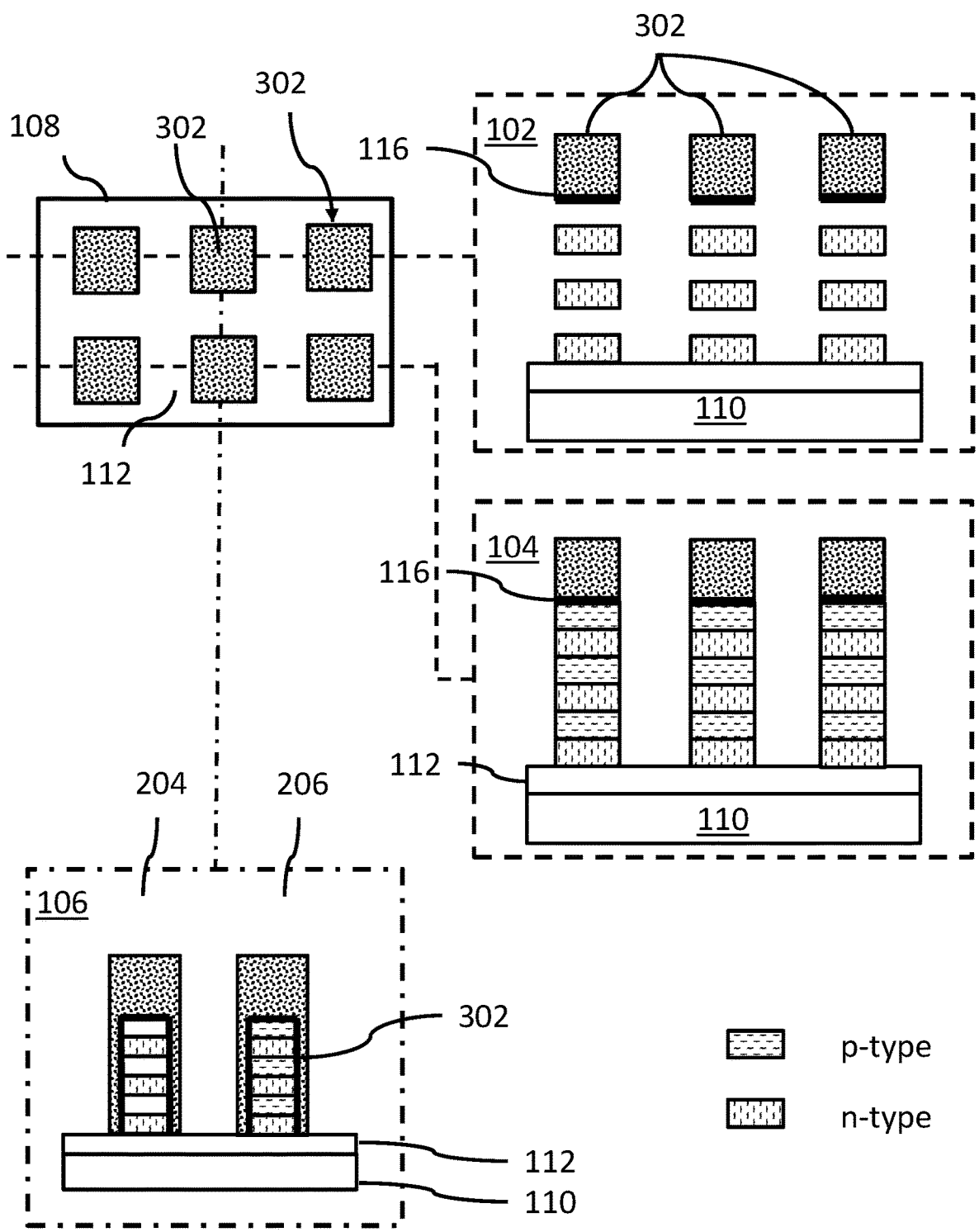

FIG. 4 shows removed channel material in pillars of one of the rows, according to some embodiments.

Figure 5:
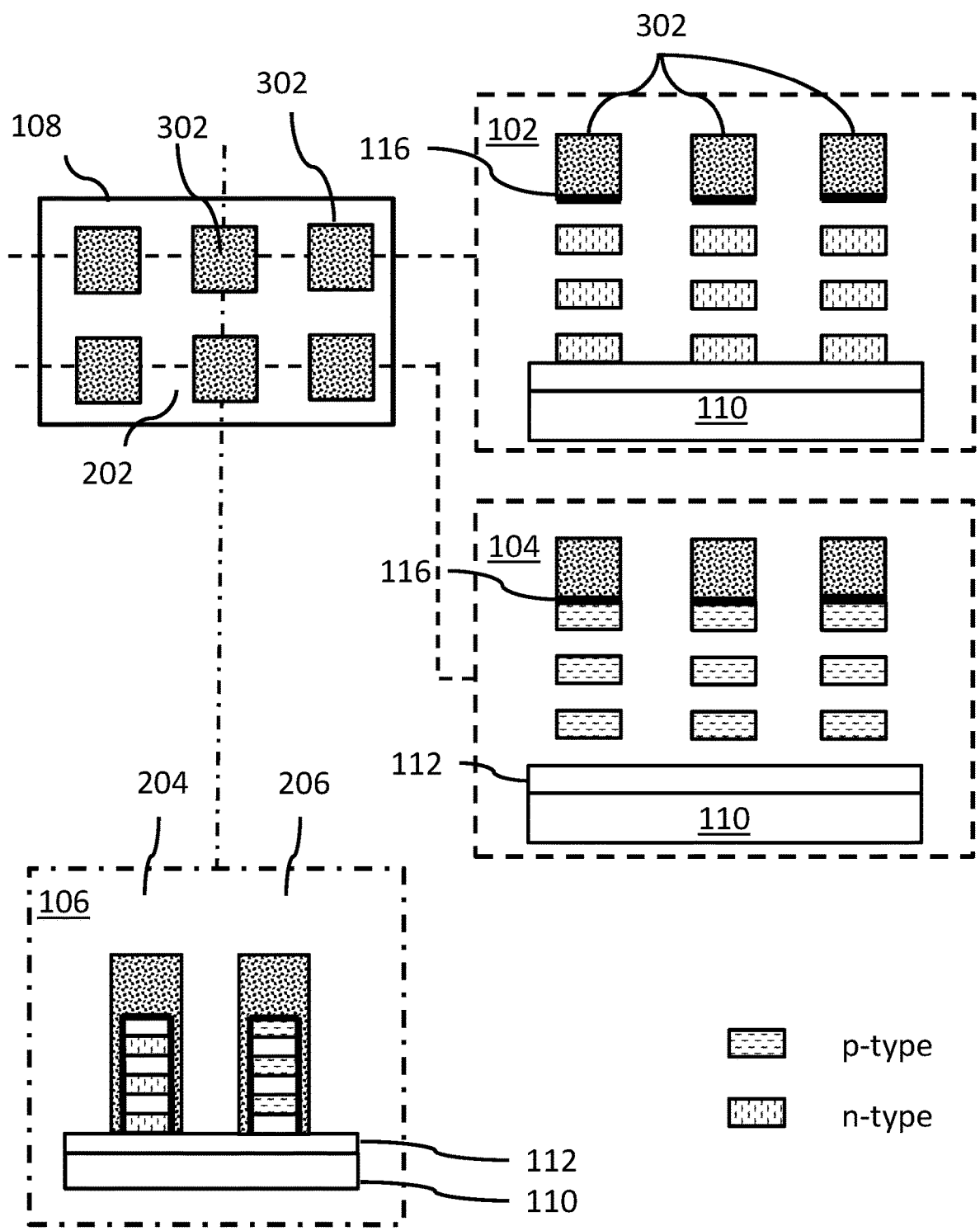

FIG. 5 shows removed channel material in pillars of the other row, according to some embodiments.

Figure 6:
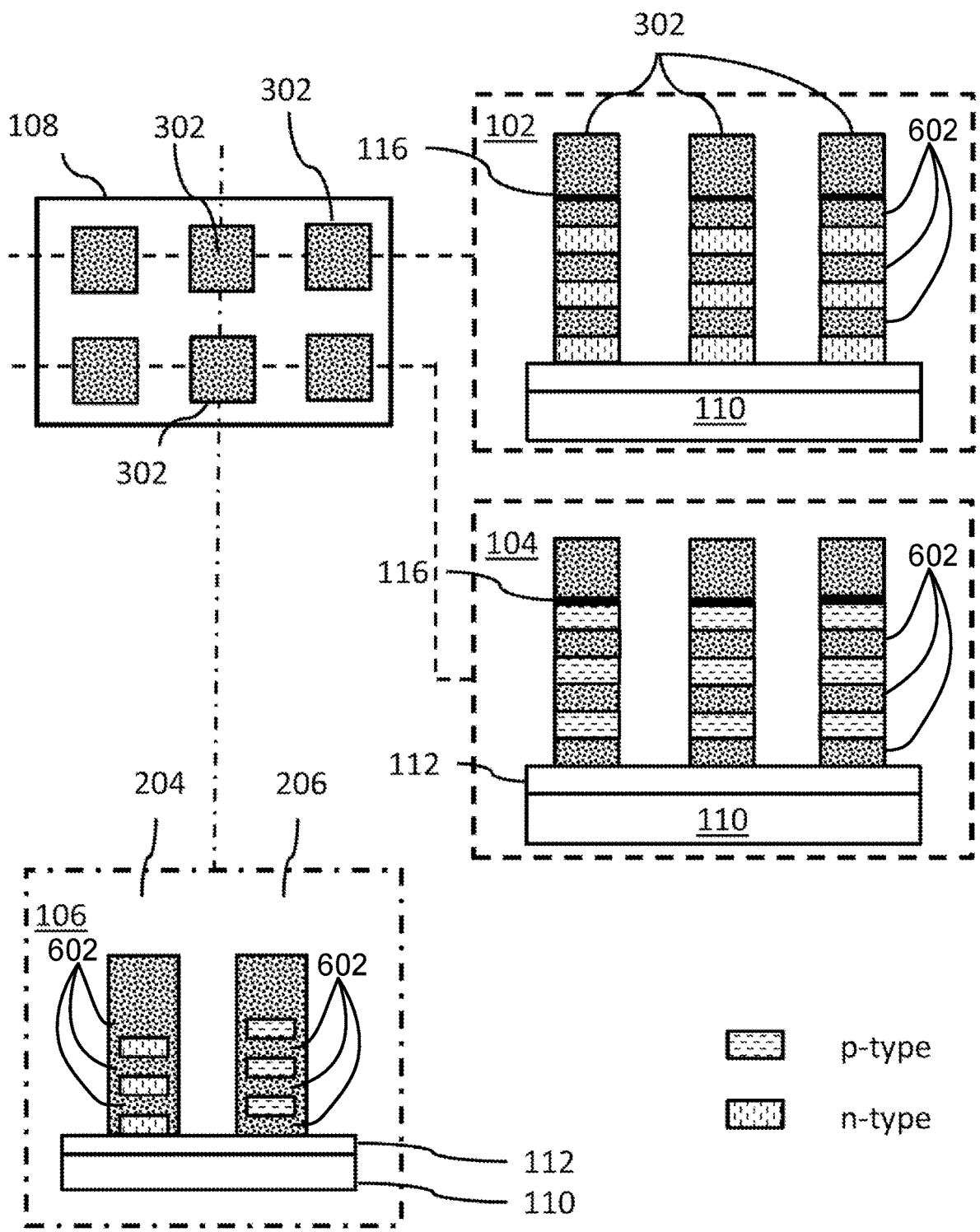

FIG. 6 shows formed gate stacks within the pillars, according to some embodiments.

Figure 7:
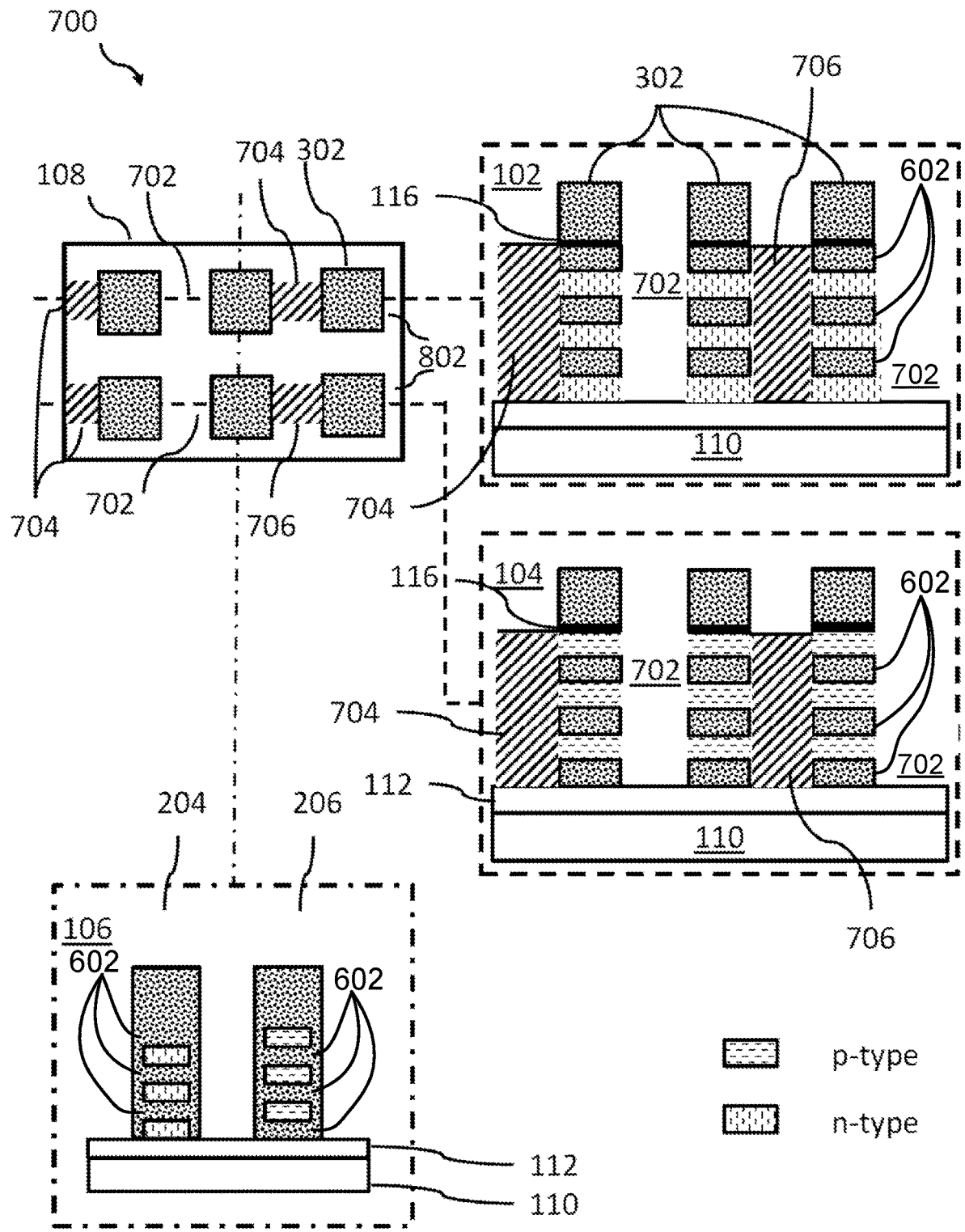

FIG. 7 shows regrown source material in every second trench of the row of nanosheet pillars, according to some embodiments.

Figure 8:
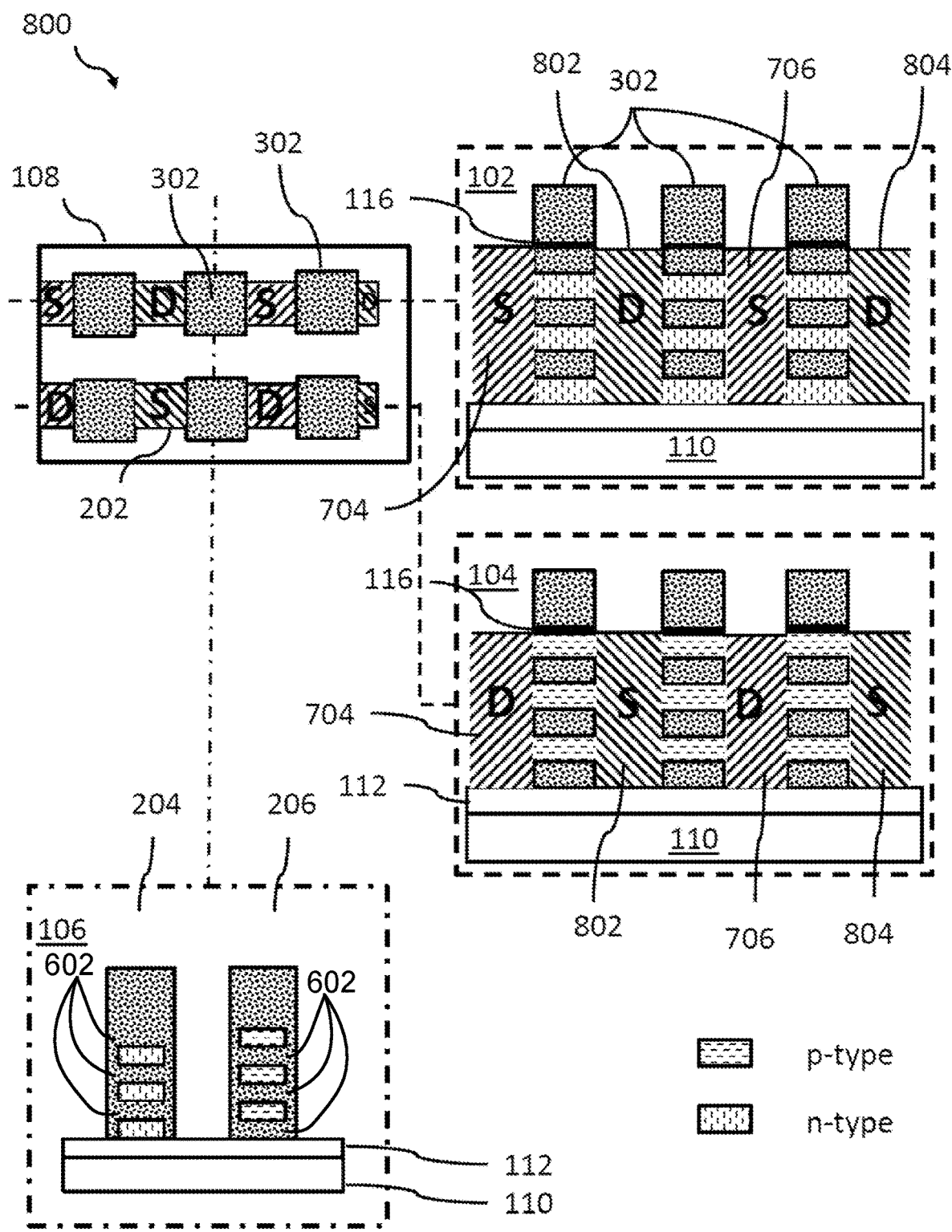

FIG. 8 shows regrown drain material in every other second trench of the rows of nanosheet pillars, according to some embodiments.

Figure 9:
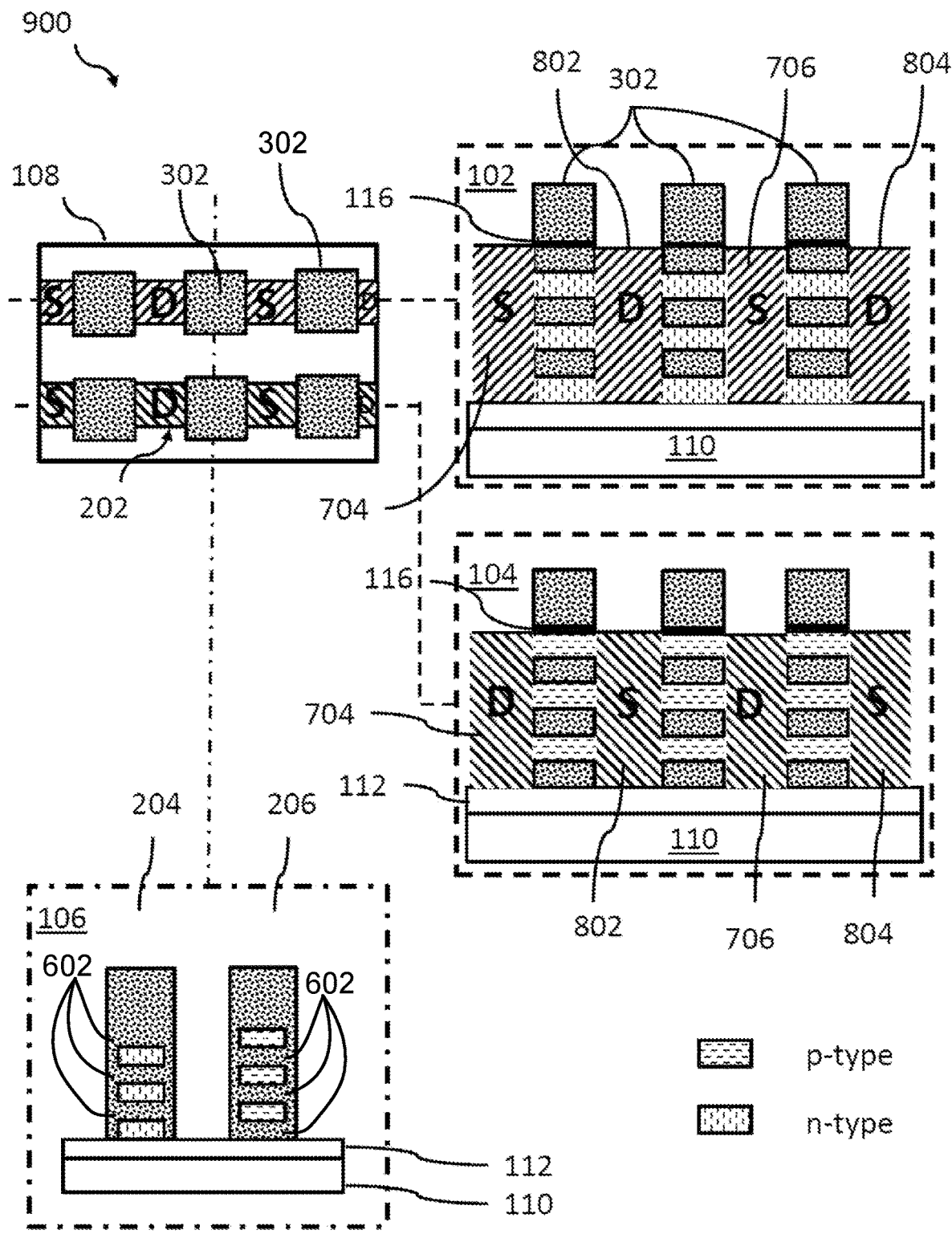

FIG. 9 shows another embodiment of the elements shown in FIG. 8.

Figure 10:
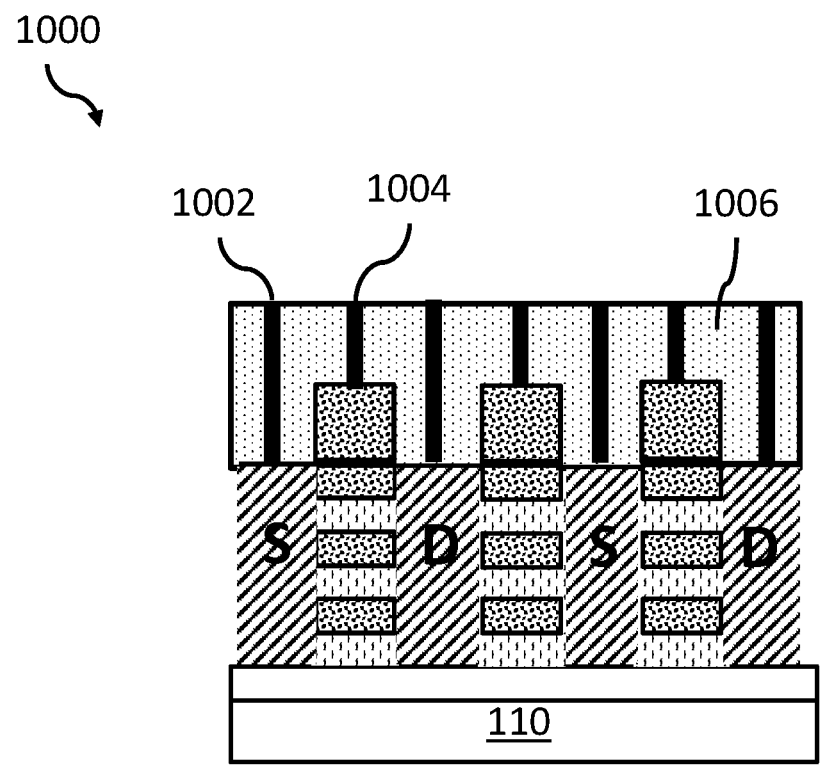

FIG. 10 shows an exemplary embodiment of a result of the proposed process with metal contacts, according to some embodiments.

Figure 11:
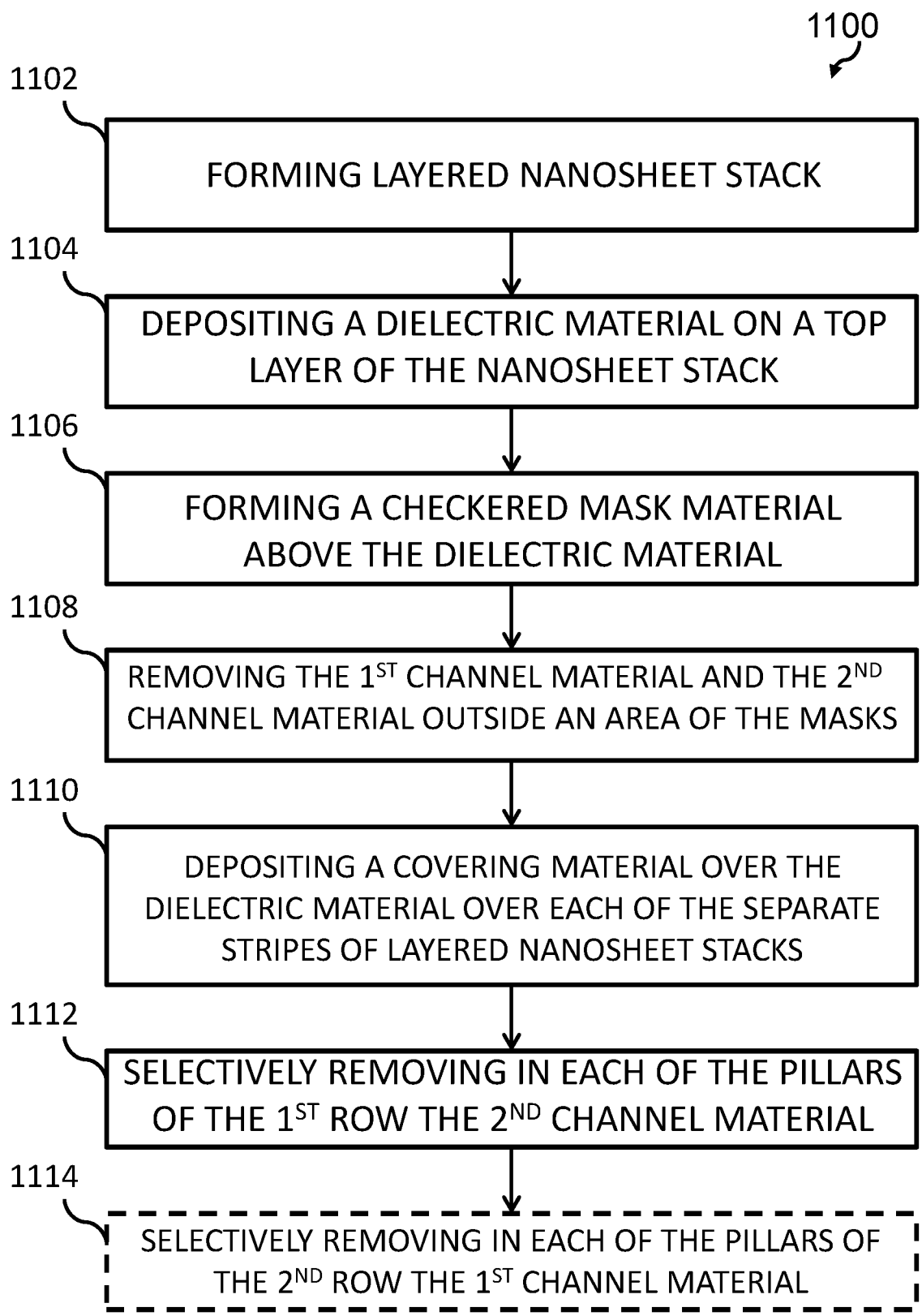

FIG. 11 shows a flowchart of some embodiments of a method for forming heterogeneous complementary FETs using a compact stacked nanosheet process.

DETAILED DESCRIPTION

In the context of this description, the following conventions, terms and/or expressions may be used:

The term "heterogeneous complementary FETs" may denote at least two field effect transistors having different channel materials. Additionally, a set of such FETs would comprise a p-FET and an n-FET. It may denote here two field effect transistors, one of which comprises a semiconductor material that the other does not. The reason for this distinction is that the metal oxide semiconductor FETs (MOSFETs) and tunneling FETs (TFETs) could have the same channel material but different source/drain materials.

The term "compact stacked nanosheet process" may denote using a plurality of nanosheets thin layers that are deposited one over the other. In this way, a multi-layer area may be built over a substrate. Different structures may be built in such a nanosheet stacked base element. Nanosheet layers may have a thickness of about 1 to 100 nm.

The term "sacrificial layer" may denote a layer that was structured in a semiconductor device during a production process, wherein the sacrificial layer or structure may be replaced by the same structure of the different—often final—material.

The term "first channel material" may denote a semiconductor material of a III-V material, like a composite of In, Ga, As, and Sb. Alternatively, or as material for the second channel material, one may use Si, Ge and Sn.

The term "dielectric layer" may denote an insulating layer, of, e.g., an oxide, nitride, or similar material without any free charge carriers.

The term "checkered mask material" may denote a mask material being deposited of individual and separated rectangle structures. In this way, at least two rows of such rectangles or regular distance to each other may be built. Although the mask material may have other comparably complex forms, the proposed base form may have the form of short regularly separated rectangles. Additionally, the at least two rows may be positioned in parallel. In some embodiments, the mask material may have the form of parallelograms being positioned on rows or, other forms.

The term "outside an area of the mask material" may denote a space below the mask material but outside the mask material and above the substrate or previously mentioned sacrificial layer on top of the substrate.

The term "covering material" may denote typically a dielectric in the form of an oxide or nitride.

The term "sidewall" may denote a surface of the structure below the mask material orthogonal to the substrate. Two types of sidewall of the pillar may be differentiated: (i) the ones being in parallel to the longitudinal extension of the respective row, and (ii) the ones being positioned orthogonal to the longitudinal extension of the respective row.

The term "pillars of nanosheet stacks" may denote substructures formerly being part of the complete nanosheet stack of the complete nanosheet-thin layer. The sub-structures may be separate nanosheet stacks or pillars now no longer being in touch with one another. In one embodiment, each pillar may have a squared horizontal cross-section ("horizontal" meaning a cross-sectional in parallel to the substrate).

The term "gate stack" may denote interconnected layers of gate material, e.g., metal-like conductive material separated from the semiconducting channels by a gate dielectric, usually a thin oxide such as $SiO_2$, $HfO_2$ or $Al_2O_3$ or combinations thereof, such that the stack is enabled to function as a capacitively coupled gate in an FET.

The term "gate-all-around" may denote a gate stack structure as a previously defined structure surrounding a channel structure in a channel-FET structure. The gate may be designed to not only influence the active channel from one side but from all around the channel structure. This may have a higher efficiency in influencing the conductivity of the channel structure.

In the following, a detailed description of the figures will be given. All instructions in the figures are schematic. Firstly, a block diagram of an embodiment of the inventive method for forming heterogeneous complementary FETs using a compact stacked nanosheet process is given. Afterwards, further embodiments, as well as embodiments of the stacked nanosheet semiconductor structure of FETs positioned in separate rows will be described.

Technology development in silicon and other semiconductor technology utilizes standard FinFET processes that are stepwise replaced by horizontal nanosheet technologies. Businesses in the semiconductor industry are focusing more and more on vertically stacked fins/sheets technologies. This has an impact, but is also influenced by the logic gate roadmap for low-power electronics with compact designs and increasing area density gain. Despite the fabrication process difficulties, nanosheet technologies—or in other words, "horizontally stacked fins"—may be considered evolution step after FinFET devices in order to move to device structures and the range from 3 nm or even 2 nm.

In addition, materials, such as III-V, traditionally difficult to integrate into standard silicon fabrication processes, get attention due to the direct band gap that may enable integrated laser sources integrated with standard silicon devices for photonic applications. Because of the higher carrier mobility and lower band gap of some II-V semiconductors, the power consumption of such devices may be reduced significantly. Stacking transistors of III-V material and of different polarity remain an unsolved problem, in particular in combination with standard complementary metal oxide semiconductor (CMOS) processes. It may be of interest, additionally, to co-integrate TFETs with MOSFETs. TFETs have shown experimentally lower sub-threshold swing (SS), which translates to low power consumption and thus, the lower heat dissipation, which is an important parameter for high density devices. Because TFETs operation is very close to that of MOSFETs and its characteristic are cascadeable, unlike other steep-slope approaches (e.g., I-MOS, MEMS, . . . ) it can directly implement in most CMOS logic cells.

Up to now, a full-blown integration of the above-mentioned technologies has not been demonstrated practically. This is mainly due to the fact that a TFET is a junction device which requires very precise process control. Additionally, complementary TFETs are challenging because p-type and n-type TFETs require different material combinations. Hence, an elegant way for an integration of hybrid logic combining the best of TFET and MOSFET would be highly desirable.

Certain methods for forming heterogeneous complementary FETs using a compact stacked nanosheet process are known. An FET including a nanosheet stack having first and second stacked semiconductor channel layers is known, where the first channel layer defines a channel region of a tunnel FET, and the second channel layer defines a channel region of a thermionic FET. Source and drain regions are provided on opposite sides of the nanosheet stack, so that the first and second channel layers extend there between them. Another known structure is a semiconductor body on a substrate with a stack comprising a buffer layer, a UID-GaN layer overlying the buffer layer, and a UID-AlGaN layer overlying the UID-GaN layer. On the surface of the UID-AlGaN layer, an insulation film is deposited and patterned. An n+-Ga layer is selectively regrown directly on a region of the surface of the semiconductor body other than the insulation film using the patterned insulation film as a mask without catching the surface of the semiconductor body. However, a direct integration into CMOS/MOSFET technology is still missing.

The proposed concept allows a sophisticated implementation of the nanosheet technology to fabricate complementarity TunnelFETs and CMOS structures on the same substrate—more or less simultaneously. The concept may include growth of alternating layers of p- and n-channel structures, respectively, followed by an optimized sequential masking process of the nanosheet pillars resulting in n-TFET and/p-TFET and nFET/p-FET devices, located in adjacent rows. The method may be applied to any material system and starting substrate in which suitable lattice matching and selective etch capability may be available.

No doping implementation may be required. The doped contact regions may be obtained by a selective growth process step, preventing the structure from any crystal damages. This may be important for the junction-based TFET device performance which is extremely sensitive to process-induced crystal damages.

So, the same hybrid platform may be used for stacked devices so far not integrated both on a single die. As known, traditionally, TFETs needed a larger number of growth steps compared to MOSFETs. This is due to the fact that the source and the drain of TFETs may require differently doped material and, for the case of complementary TFETs, also different materials for the channels. The concept proposed here overcomes the hitherto insurmountable hurdle in the production of TFETs with scaled lateral complementarity in a respective production process or method that is compatible with CMOS standards.

Such a co-integration with MOSFETs is also highly desirable and necessary to fully leverage the potential of ultra-low-power hybrid technology. A technology platform which enables both, complementarity TFETs and MOSFETs, that did not exist before.

A further advantage of the here proposed concept can be seen in a very dense co-integration between TFETs and MOSFETs, i.e., as dense as the transistor density of a homogenous technology (for instance, a common Si CMOS technology) may be made feasible. This is because the distinction between TFET and MOSFET in this method is only made by the contact material which does not add a separation between adjacent transistors.

The nanosheet structure with the gate-all-around may furthermore provide for the most optimum in terms electrostatic control of the channel. A gate-all-around architecture might be particularly beneficial for high mobility III-V materials, due to their lower density of states quantization effects appear at larger dimensions compared to silicon devices, for example increasing their bandgap to reduce off-state leakage.

According to some embodiments, the method may also comprise selectively removing—i.e., etching—in each of the pillars of the second row the first channel material. This may be performed by masking and/or covering the complete second row of pillars and other well-known process steps.

According to some embodiments, the method may also comprise depositing a dielectric material on the sidewalls of the pillars before selectively removing the channel material. Thereby, the sidewalls may be positioned in parallel to a longitudinal extension of the respective row. This feature may keep free hanging channel material structure from collapsing.

Alternatively, according to some embodiments, the method may also comprise a partial selective etching of the channel material to be removed before depositing a dielectric material on the sidewalls of the pillars. This feature may improve the mechanical support of the free hanging channel material structure. This feature may be similar to the internal spacer process used in today's nanosheet processes.

According to one embodiments, the method may also comprise forming a gate stack comprising a gate-all-around structure around all channels for each of the pillars of the first and second row. This process step may be performed as one of the comparably last steps of the proposed process by replacing a dummy gate stack by a final metal comprising gate stack in order to not contaminate (doping by accident) the already prepared structures.

Furthermore, one may use the replacement gate because the elevated temperatures used for the growth of source and drain is not good for the gate dielectric; so, one can achieve the best gate stacks with least leakage by depositing it after the high temperature processing has been done.

According to some embodiments, the method may comprise selectively filling every second space between the pillars in a first row with a first source material such that the first source material may be in direct contact with the channels of adjacent ones of the pillars of the first row. A dummy source may be grown in the spaces to be filled which may be replaced later by a real source material.

According to some embodiments, the method may also comprise selectively filling every other second space between the pillars in the first row with a first drain material, such that the first drain material may be in direct contact with the channels of adjacent ones of the pillars of the first row.

According to some embodiments, the method may also comprise selectively filling every second space between the pillars in a second row with a second source material, such that the second source material may be in direct contact with the channels of adjacent ones of the pillars of the second row.

According to some embodiments, the method may also comprise selectively filling every other second space between the pillars in the second row with a second drain material, such that the second drain material may be in direct contact with the channels of adjacent ones of the pillars of the second row. The first and the second source material may be identical. This may also apply to the first and second drain material. The source and drain materials in the second row may also be dummy materials, which are later replaced by the final source and drain materials.

According to some embodiments of the method, the first channel material and the second channel material may each be a mixture of In, Ga, As, and Sb ranging from InAs to GaSb. Thereby, the composite material may be expressed as $In_{1-x}Ga_xAs_ySb_{1-y}$.

According to an alternative embodiment of the method, the first channel material and the second channel material may be each a mixture of Si, Ge, and Sn and compounds thereof. Hence, a wide variety of materials and material composites may be used successfully.

According to some embodiments of the method, the first sacrificial material may be InP. If compared to the channel materials, there may be a good etch selectivity between indium phosphide and the other, already mentioned, channel materials.

According to some embodiments of the method, the first row and the row of the checkered mask material may be positioned in parallel and separated from one another. However, also other horizontal angles between the rows may be possible.

According to some embodiments of the method, the source and drain of a sheet structure may be of the same material. In this case, the resulting device structure may represent a MOSFET.

According to some embodiments of the method, the source and drain of a sheet structure may be of different material. In this case, the resulting device structure may represent a TFET. It may be assumed that a skilled person will know the additionally useful spacers in the resulting semiconductor structure in order to enable the asymmetric gate structure required for the junction based TFET device.

FIG. 1 shows a stack 114 of nanosheet layers on a substrate 110. Also, optionally, another layer 112, which may be a sacrificial layer (the purpose will be explained below) or an oxide layer or another dielectric layer, can be deposited between the substrate 110 and the nanosheet layers 114. The stack of nanosheet layers comprises heterogeneous materials, i.e., a sheet-like layer of first material alternates with a sheet-like layer of a second material. Typically, the first and second material are, e.g., composites of III-V materials, as described above.

For comprehensibility reasons, this and the following figures show cross-section views 102, 104, 106 and a top view 108 which represents a portion of a larger wafer. On top of the stack 114 of nanosheet layers, a dielectric layer 116 is deposited. The legend of FIG. 1 (lower right corner) indicates that the alternating layers of the stack 114 are materials of p-type and n-type. For comprehensibility reasons, only in the cross-section 106, the nanosheet stack 114 carries a reference numeral.

FIG. 2 shows a result of an embodiment of a deposition of a checkered-like mask 202 and building two rows (although this may be many rows) of nanosheet pillars 204, 206. In this embodiment, the rows are positioned in parallel, as can easily be seen from the top view 108. However, other geometrical relationships may exist between rows of pillars 204, 206. The cross-section 102, 104 and 106 show that all outside the checkered mask material 202 nanosheet layers has been removed down to the optional oxide or sacrificial layer 112. Thus, the nanosheet stack 204, 206 or, the now better, separated nanosheet pillars (including the top layer of mask material) exists only below the mask material 202. For masking and etching steps, known techniques can be used.

FIG. 3 shows deposited covering material 302 over the individual nanosheet pillars 204, 206. The covering material 302 may also be a dielectric material. It may optionally be a different material than the dielectric 116 (but does not have to be). It is also surrounding the nanosheet stack 114 (compare FIG. 1); this is indicated by a bold line on three sides of the nanosheet stack. In an alternative embodiment, below the lowest layer n-type channel material, a further dielectric layer may be present. Hence, in this embodiment, at least as seen in the cross-section 106, the nanosheet stack 114 would be covered from four sides with a dielectric (bold line, at least left and right of the nanosheet stack 114).

FIG. 4 shows removed channel material—here p-type channel material—in pillars of one of the rows, name in cross section 102, i.e., the lower row of pillars as seen from the top view 108 and the cross section 106. The removed channel material can be recognized in the pillar 204 in the cross-section 106. The pillar(s) 206 still has/have both channel materials inside.

FIG. 5 shows that channel material has also been removed from the pillars 206 of the second row (upper row in top view 108). However, the removed material is now of different material if compared to the pillars of the first row. Namely, n-type channel material (intermittently vertical striped) has been removed from the nanosheet pillars 206 in the cross section 102. The leftover channel materials in the pillars of the different rows do not horizontally overlap, but are on different levels over the substrate 110.

FIG. 6 shows that areas of removed channel material in the pillars have now been filled with a gate stack 602 (either dummy gate or final gate material). Known masking, etching, and deposition process steps can be used. As can be seen in the cross-section 106, the gate stacks—in a gate-all-around form—go around the channel materials.

FIG. 7 shows a view 700 of regrown source material 704, 706 in every second trench of a row of pillars. Cross-sections 102, 104 show that on the left most side directly adjacent to the left most pillar in the upper row of the top view 108, contact material 704 (source or drain) to the channel material in the left most pillar has been regrown. All required trenches 702 have been grown in a previous (not shown) process step. A skilled person will know how to avoid filling the open trenches 702 (by masking, filling sacrificial material, removing again/etching, and so on). It can also be recognized that the deposited drain or source material is of the same type material, as indicated by upwards oriented diagonal stripes.

FIG. 8 shows a view 800 on regrown drain material 802, 804 in every other second trench of the rows of nanosheet comprising pillars. Hence, each row of nanosheet pillars shows alternating source 804 and drain 802 areas between the pillars in direct contact with the respective active channels. These are, e.g., of n-type material in cross section 102 and of p-type material in cross section 104. The alternating source 704 and drain 802 (or 706 and 804) areas or regions may render this structure ideal for TFETs. A skilled person will know where to add vertical liner material in order to build the asymmetric gate so that the typical junction characteristic of a TFET can be achieved.

FIG. 9 shows a view 900 of another embodiment of the elements shown in FIG. 8. FIG. 9 shows the same source 704 and drain 802 (or 706, 804) material—i.e., rising diagonally striped—in one row of the nanosheet pillars, hence, a MOSFET structure. Cross-section 104 shows that other material for source and drain (falling diagonally striped) is used due to the different channel material. In both rows of pillars 204, 206, MOSFETs have been fabricated.

At this point in time, a potential dummy gate material can be replaced by real metal gate material such that all channel material may have a capacitive coupling to the gate in a gate-all-around structure. The sacrificial layer 112 below the lowest channel layer in cross section 102 may have been removed in order to build the gate-all-around for the gate stack. Otherwise, the lowest layer may have incompatible characteristics if compared to the other channel layers. Furthermore, the proposed structure would generally also work with only one channel layer per row and pillar. However, for efficiency reasons, at least two channel layers per pillar are recommended. However, also three or more channel layers per channel material—i.e., per pillar and row—may be used.

Because of the comparably elegant option to fill the former trenches 702 (compare FIG. 7) with the same or different source and drain material per row, it becomes understandable that a highly-sophisticated, but also elegant, way has been presented to mix and match TFET structures with CMOS/MOSFET structures on the same die.

FIG. 10 shows an example embodiment 1000 of a result of the proposed process with metal contacts 1002, 1004. For clarity reasons, only two of the many vertical bold lines symbolizing contacts to the active lower layers of the device 1000 are shown. The contacts 1002, 1004 are embedded in a covering dielectric cover layer 1006.

FIG. 11 shows a flowchart of an embodiment of a method 1100 for forming heterogeneous complementary FETs using a compact stacked nanosheet process. The method 1100 comprises forming, 1102, on a first sacrificial layer and over a substrate—e.g., Si—a layered nanosheet stack comprising at least two layers of a first channel material alternating with at least two layers of a second channel material. An oxide layer—e.g., a dielectric layer—may also be positioned between the substrate and the lowest layer of the channel material. This may later be used as sacrificial material for building a gate-all-around structure for the lowest nanosheet layer.

The method 1100 also comprises depositing 1104 a dielectric layer atop the highest layer of the nanosheet stack. This structure may work with only a single layer of the first and the second channel material. However, for efficiency reasons it is advisable to use at least two general layers. However, the proposed concept also works with more than two channel layers of the different channel materials.

Moreover, the method 1100 also comprises forming 1106 checkered mask material with at least a first and a second row above the dielectric material, wherein the first and the second row are distanced from each other. Typically, the first row and the second row are positioned in parallel and separated from one another. However, they may also be positioned having an angle between them.

Additionally, the method 1100 comprises removing (e.g., selectively removing, selectively etching) 1108 the first channel material and the second channel material outside an area of the checkered mask material resulting in a first row of pillars and a second row—e.g., parallel—of pillars of layered nanosheet stacks.

Then, the method 1100 comprises depositing 1110 a covering material—such as an oxide or nitride layer—over each of the separate pillars of layered nanosheet stacks. The covering material also covers sidewalls of the pillars of layered nanosheet stacks, wherein the sidewalls are positioned in parallel to the long extension of the first row and the second row and orthogonal to the substrate.

Furthermore, the method 1100 comprises selectively removing (i.e., selectively etching) 1112 in each of the pillars of the first row the second channel material. Optionally, and useful for a working device, the method 1100 comprises selectively removing 1114 in each of the pillars of the second row the first channel material (shown as dash line box). During further fabrication steps, additional structures like source and drain, stacks gate structures, a covering dielectric and contacts are added, respectively.

The flowcharts and/or block diagrams in the figures illustrate the architecture, functionality, and operation of possible implementations of methods, and structures according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or act or carry out combinations of special purpose hardware and computer instructions.

The terminology used herein is for the purpose of describing particular embodiments only and is not intended to limit the invention. As used herein, the singular forms 'a', 'an' and 'the' are intended to include the plural forms as well, unless the context clearly indicates otherwise. It will further be understood that the terms comprises and/or comprising, when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present disclosure has been presented for purposes of illustration and description, but is not intended to be exhaustive or limited to the invention in the form disclosed. Many modifications and variations will be apparent to those of ordinary skills in the art without departing from the scope and spirit of the invention. The embodiments are chosen and described in order to best explain the principles of the invention and the practical application, and to enable others of ordinary skills in the art to understand the invention for various embodiments with various modifications, as are suited to the particular use contemplated.

What is claimed is:

1. A method for forming heterogeneous complementary FETs using a compact stacked nanosheet process, the method comprising:
   forming, on a first sacrificial layer and over a substrate, a layered nanosheet stack comprising at least two layers of a first channel material alternating with at least two layers of a second channel material;
   depositing a dielectric layer on a top layer of the nanosheet stack;
   forming a checkered mask material with at least a first and a second row above the dielectric material, wherein the first and the second row are distanced from each other;
   removing the first channel material and the second channel material outside an area of the checkered mask material resulting in at least a first row of pillars and a second row of pillars of layered nanosheet stacks;
   depositing a covering material over each of the dielectric layer over each of the separate pillars of layered nanosheet stacks, wherein the covering material also covers sidewalls of the rows of layered nanosheet stacks, the sidewalls being positioned in parallel to a long extension of the first row and the second row and orthogonal to the substrate; and
   selectively removing in each of the pillars of the first row the second channel material.

2. The method according to claim 1, further comprising selectively removing in each of the pillars of the second row the first channel material.

3. The method according to claim 2, further comprising:
   depositing a dielectric material on the sidewalls of the pillars of the first row and the second row, the sidewalls being positioned in parallel to a longitudinal extension of the respective row, before selectively removing the channel material.

4. The method according to claim 2, further comprising:
   forming a gate stack comprising a gate-all-around structure around all channels for each of the pillars of the first and second row.

5. The method according to claim 4, further comprising:
   selectively filling every second space between the pillars in a first row with a first source material, such that the first source material is in direct contact with the channels of adjacent ones of the pillars of the first row.

6. The method according to claim 5, further comprising: selectively filling every other second space between the pillars of the first row with a first drain material, such that the first drain material is in direct contact with the channels of adjacent ones of the pillars of the first row.

7. The method according to claim 4, further comprising: selectively filling every second space between the pillars in the second row with a second source material, such that the second source material is in direct contact with the channels of adjacent ones of the pillars of the second row.

8. The method according to claim 7, further comprising: selectively filling every other second space between the pillars in a second row with a second drain material, such that the second drain material is in direct contact with the channels of adjacent ones of the pillars of the second row.

9. The method according to claim 8, wherein the source and drain of the nanosheet structure is of the same material.

10. The method according to claim 8, wherein the source and drain of a sheet structure is of different material.

11. The method according to claim 1, wherein the first channel material and the second channel material are each a mixture of In, Ga, As, and Sb ranging from InAs to GaSb.

12. The method according to claim 1, wherein the first channel material and the second channel material are each a mixture of Si, Ge, and Sn and compounds thereof.

13. The method according to claim 1, wherein the first sacrificial material is a material selected from the group consisting of InP, $SiO_2$, and $Al_2O_3$.

14. The method according to claim 1, where in the first row and the row of the checkered mask are positioned in parallel and separated from one another.

15. A stacked nanosheet semiconductor structure of FETs positioned in separate rows, the structure comprising:
   layered nanosheet pillars over a substrate positioned in a first row with a first predefined distance to one another comprising at least two layers of a first channel material embedded in a gate-all-around structure;
   layered nanosheet pillars over the substrate positioned in a second row with a second predefined distance to one another comprising at least two layers of a second channel material embedded in a gate-all-around structure, wherein the second channel material is different from the first material;
   a gate dielectric material of the gate-all-around structure on a top layer of the nanosheet pillars also covering sidewalls of the pillars parallel to a longitudinal extension of the first row and the second row, and wherein sidewalls of the pillar positioned vertically to the extension of the first and second row and vertical to the substrate are not covered by the gate dielectric material; and
   alternating source and drain areas between the pillars in a direction of the first and the second row, wherein the source and drain areas are in contact with the at least first and second channel material, respectively, thereby building a sequence of directly connected FETs in each row;
   wherein the channel material in the nanosheet pillars in the first row does not horizontally overlap the channel material in the nanosheet pillars in the second row.

16. The structure according to claim 15, further comprising:
   a gate stack in each of the pillars in each of the rows comprising gate-all-around structures around all channels separately for each of the pillars of the first and second row.

17. The structure according to claim 15, wherein the first channel material and the second channel material are each a mixture of In, Ga, As, and Sb ranging from InAs to GaSb.

18. The structure according to claim 15, wherein the first channel material and the second channel material are each a mixture of Si, Ge, and Sn, and compounds thereof.

19. The structure according to claim 15, wherein the source and drain of a sheet structure is of the same material.

20. A stacked nanosheet semiconductor structure of FETs positioned in separate rows, the structure comprising:
   layered nanosheet pillars over a substrate positioned in a first row with a first predefined distance to one another comprising at least two layers of a first channel material embedded in a gate-all-around structure;
   layered nanosheet pillars over the substrate positioned in a second row with a second predefined distance to one another comprising at least two layers of a second channel material embedded in a gate-all-around structure, wherein the second channel material is different from the first material;
   a gate dielectric material of the gate-all-around structure on a top layer of the nanosheet pillars also covering sidewalls of the pillars parallel to a longitudinal extension of the first row and the second row, and wherein sidewalls of the pillar positioned vertically to the extension of the first and second row and vertical to the substrate are not covered by the gate dielectric material; and
   alternating source and drain areas between the pillars in a direction of the first and the second row, wherein the source and drain areas are in contact with the at least first and second channel material, respectively, thereby building a sequence of directly connected FETs in each row;
   wherein the source and drain of a sheet structure is of different material.

* * * * *